United States Patent
Li et al.

(10) Patent No.: US 10,923,583 B2
(45) Date of Patent: Feb. 16, 2021

(54) IGBT DEVICE WITH MOS CONTROLLABLE HOLE PATH

(71) Applicant: University of Electronic Science and Technology of China, Chengdu (CN)

(72) Inventors: Zehong Li, Chengdu (CN); Xin Peng, Chengdu (CN); Yishang Zhao, Chengdu (CN); Min Ren, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/601,609

(22) Filed: Oct. 15, 2019

(65) Prior Publication Data

US 2020/0235231 A1    Jul. 23, 2020

(30) Foreign Application Priority Data

Jan. 23, 2019 (CN) .......................... 201910062000.7

(51) Int. Cl.
*H01L 29/78* (2006.01)
*H01L 29/739* (2006.01)
(Continued)

(52) U.S. Cl.
CPC ...... *H01L 29/7397* (2013.01); *H01L 29/1095* (2013.01); *H01L 29/4236* (2013.01)

(58) Field of Classification Search
CPC ............. H01L 29/7397; H01L 29/1095; H01L 29/4236; H01L 29/083; H01L 29/42376; H01L 29/417; H01L 29/0619; H01L 29/407; H01L 29/43236; H01L 29/7813; H01L 29/66348; H01L 29/0623; H01L 29/41766; H01L 29/0634; H01L 29/66734; H01L 29/7811; H01L 29/0696;
(Continued)

(56) References Cited

U.S. PATENT DOCUMENTS 8,853,786 B1* 10/2014 Kadow ............... H01L 27/0727
257/368
2010/0078674 A1* 4/2010 Seok ................... H01L 29/7397
257/139
(Continued)

*Primary Examiner* — Steven H Loke
*Assistant Examiner* — Samuel Park
(74) *Attorney, Agent, or Firm* — Bayramoglu Law Offices LLC

(57) ABSTRACT

The present invention relates to the technical field of power semiconductor devices, particularly to an insulated gate bipolar transistor with a MOS controllable hole path. According to the present invention, a MOS controllable gate structure formed by a gate dielectric layer, a MOS control gate electrode and a P-type MOS channel region are embedded in a P+ floating p-body region of the conventional IGBT structure. The MOS region is equivalent to a switch controlled by a gate voltage. When the device is turned on under a forward voltage, the potential of the p-body region is floated to store holes, reducing the saturation conduction voltage drop of the device. Under the condition of turn-off and short-circuit, the hole extracting path is provided and the Miller capacitance is lowered, thereby lowering the turn-off losses and enhancing the short-circuit withstand capability.

7 Claims, 3 Drawing Sheets

(51) Int. Cl.
  *H01L 29/10*  (2006.01)
  *H01L 29/423*  (2006.01)
(58) Field of Classification Search
  CPC ............... H01L 29/404; H01L 29/7395; H01L 29/7396; H01L 29/78
  See application file for complete search history.

(56) References Cited

U.S. PATENT DOCUMENTS

| | | | |
|---|---|---|---|
| 2014/0124829 A1* | 5/2014 | Andenna | H01L 29/7397 257/139 |
| 2016/0359029 A1* | 12/2016 | Zeng | H01L 29/0834 |
| 2017/0069727 A1* | 3/2017 | Blanchard | H01L 29/0623 |
| 2018/0261666 A1* | 9/2018 | Zeng | H01L 29/7802 |
| 2020/0227527 A1* | 7/2020 | Lyu | H01L 29/739 |

* cited by examiner

IGBT DEVICE WITH MOS CONTROLLABLE HOLE PATH

CROSS REFERENCE TO THE RELATED APPLICATIONS

The present application is based upon and claims priority to Chinese Patent Application No. 201910062000.7 filed on Jan. 23, 2019 the entire contents of which are incorporated herein by reference.

TECHNICAL FIELD

The present invention relates to the technical field of power semiconductor devices, particularly to an insulated gate bipolar transistor (IGBT) device with MOS controllable hole path.

BACKGROUND

Insulated Gate Bipolar Transistors (IGBTs) are widely used in important fields such as rail transit, smart grid and wind power generation, due to their advantages of easy gate drive, high input impedance, high current density and low on-state voltage drop, etc. IGBT has become one of the dominant power switching devices in the medium and high power range, and will continue to advance to reach the goals of high power density, low power loss, high operating temperature, high reliability, and the like.

The planar gate structure is a mature structure commonly used in high-voltage IGBTs. The planar gate structure is used in some settings including high-speed railway and power transmission etc., where a high reliability is required. However, due to the parasitic resistance, planar gate IGBTs have larger on-state voltage drop compared to trench gate structures, and the on-state loss is increased. While, the Trench-gate IGBT (TIGBT) having a small cell pitch and a large current density has become a common structure for reducing the conduction loss. However, there is a high electric field at the bottom of the trench gate of the TIGBT, which limits the increase of the blocking voltage. Moreover, the TIGBTs have large short-circuit current and weak short-circuit withstand capability. The electric field peak can be reduced by introducing a floating p-type shielding layer at the bottom of the trench gate, which will increase the power loss by the additional JFET resistance. In addition, an introduction of clamping diodes in the P-base region between the trench gates can improve the turn-off energy loss and saturation voltage ($E_{off}$-$V_{cesat}$) trade-off relationship and strengthen the short-circuit withstand capability of the device simultaneously, but the existing products are mostly concentrated on the 1200V voltage level. By using a wide trench gate pitch or FP (Floating P-body) region, the current density of the devices can be reduced, thus the short-circuit withstand capability of the TIGBT can be significantly improved. However, in TIGBT with the FP region, a displacement current at the gate terminal generated by Miller capacitance Cgc due to the negative gate capacitance effect causes fluctuations in the control gate voltage, which reduces the gate control capability of the IGBT and causes EMI noise problems.

For TIGBT structure with voltage level of 1700V or less, the EMI problems can be improved by structures including Fin p-Body, Shield trench and Side-gate etc., but these structures require strict manufacturing process accuracy. For IGBTs with voltage levels greater than 2500V, IGBT suppliers have launched TIGBT products of 3300V voltage, which reduce the electric field peak at the bottom of the trench gate, enhances the conductance modulation, and improves the $E_{off}$-$V_{cesat}$ trade-off relationship by means of a Separate Floating P-body (SFP) region with a junction depth larger than the trench gate depth. However, the SFP region will weaken the breakdown voltage and enlarge the on-state voltage drop. What's more, some of the hole paths can be realized by the SFP region connected to the ground through a fixed resistor, which will cause the increased conduction loss and reduced design compromise window.

SUMMARY

In view of the above, the present invention provides an IGBT with a MOS controllable hole path for overcoming the problem that the potential variation of the SFP region causes the lowered breakdown voltage and large turn-off loss of the device induced by the conventional SFP-TIGBT. The control structure of the hole carrier releasing path is formed by the MOS structure embedded in the SFP region and can be regarded as a variable resistor, which can reduce the Miller capacitance and turn-off loss while ensuring the reliability and short-circuit withstand capability.

In order to achieve the above objective, the technical solution of the present invention is as follows.

An IGBT device with a MOS controllable hole path with its cell structure include a collector metal electrode 7, a P+ collector region 6, an N-type buffer layer 5, an N-type drift region 4, and an emitter metal electrode 11. The collector metal electrode 7, the P+ collector region 6, the N-type buffer layer 5, the N-type drift region 4, and the emitter metal electrode 11 are stacked in order from bottom to top. The P+ floating p-body region 8 is disposed on the middle upper surface of the N-drift region 4. The P+ base regions 2 are disposed on both sides of the P+ floating p-body region 8, respectively. The N+ emitter region 1 is disposed on the upper surface of the P+ base region 2. The N+ emitter region 1 and the P+ base region 2 are respectively connected to the emitter metal electrode 11. The IGBT gate structure is set between the N+ emitter region 1, the P+ base region 2 and the P+ floating p-body region 8. The IGBT gate structure is not in the P+ floating p-body region 8. The IGBT gate structure includes a gate electrode 9 and a gate dielectric layer 3. The gate dielectric layer 3 extends along a longitudinal direction of the device into the N-drift region 4 to form a trench, and the gate electrode 9 is embedded in the trench. One side of the gate dielectric layer 3 is in contact with the P+ base region 2, the N+ emitter region 1 and the N-drift region 4. The P+ floating p-body region 8 is not adjacent to the other side of the gate dielectric layer 3 and is separated with the other side of the gate dielectric layer 3 by the N-drift region 4.

The MOS control gate structure including a gate dielectric layer 3, a MOS control gate electrode 14 and a P-type MOS channel region 15 is embedded in the P+ floating p-body region 8. The P-type MOS channel region 15 is disposed on the middle upper surface of the P+ floating p-body region 8, which is connected to the P+ base region 2 and the N+ emitter region 1 by the P+ contact region 13 and emitter metal electrode 11. The MOS control gate electrode 14 is symmetrically disposed on both sides of the P-type MOS channel region 15 and is isolated from the P-type MOS channel region 15 by the gate dielectric layer 3. The MOS control gate electrode 14 is isolated from the P+ floating p-body region 8 by the gate dielectric layer 3. The MOS control gate electrode 14 is connected to the IGBT gate electrode 9 through the connecting bridge 12. The emitter metal electrode 11 and the connecting bridge 12, and the connecting bridge 12 and the N-drift region 4 are separated by a dielectric layer 10, respectively.

Preferably, the MOS control gate structure is located in a neutral region of the P+ floating p-body region 8 in a forward blocking state.

Preferably, the width of the P-type MOS channel region 15 is less than the width of an electron accumulation layer generated by the MOS control gate electrode 14 during the on-state.

Preferably, the MOS control gate electrode 14 has the same structure as the IGBT gate electrode 9, or is a sharp-angle MOS control gate electrode to further reduce the Miller capacitance.

Preferably, the junction depth of the P+ floating p-body region 8 is greater than the depth of the IGBT gate structure, so that the electric field at the bottom of the IGBT gate structure (i.e. trench gate) is suppressed during the forward blocking state of the device as a depletion region is formed by the P+ floating p-body region 8 and the N-drift region 4, thereby ensuring the reliability of the trench gate high voltage IGBT under the forward voltage.

Preferably, the doping mode of the P+ floating p-body region 8 is non-uniform doping.

Preferably, the material of the semiconductor used in the device can be single crystal silicon, silicon carbide or gallium nitride.

The MOS control gate structure formed by the gate dielectric layer 3, the MOS control gate electrode 14 and the P-type MOS channel region 15 and embedded in the P+ floating p-body region 8 needs to meet the following requirements.

1. The P+ floating p-body region 8 is separated from the IGBT gate structure by the N-drift region 4.

2. The gate dielectric layer 3 is located in the neutral region of the P+ floating p-body region during the forward blocking state.

3. The thickness of the gate dielectric layer 3 at the side close to the P-type MOS channel region 15 is less than the thickness of the gate dielectric layer 3 between the MOS control gate electrode 14 and the separate P+ floating p-body region 8.

4. A width of electron accumulation layer on the surface of the P-type MOS channel region 15 generated by the positive gate voltage due to the injection enhancement (IE) effect on the MOS control gate electrode 14 can completely block off the width of MOS channel region.

Compared with the prior art, the advantages of the present invention are illustrated as follows.

1. According to the present invention, the MOS control gate structure which is provided in the P+ floating p-body region is equivalent to a switch that is controlled by the IGBT gate voltage. When the device is turned on in the forward direction, the potential of the P+ floating p-body region is floated, thereby realizing hole storage and reducing the on-state voltage drop. As the device is blocked off in the forward direction, and the P-type MOS channel is formed to release the holes rapidly, reducing turn-off time and turn-off loss.

2. The potential of the P+ floating p-body region is set to zero by the MOS control gate during switching, lowering the Miller capacitance $C_{gc}$ and effectively reducing the switching loss.

3. The MOS control gate electrode 14 under the forward voltage causes surface electron accumulation in the P-type MOS channel region 15, and the surface electron accumulation disappears during the short-circuit, so that the potential of the P+ floating p-body region is set to zero to provide a hole extracting path under the short-circuit, suppressing the thermal runaway phenomenon and strengthening the short-circuit withstand capability.

4. The shape of the MOS control gate electrode 14 and the doping concentration of the P-type MOS channel region 15 can be changed to adjust the Miller capacitance $C_{gc}$ of IGBT devices, thereby achieving better control of the switching process.

5. The MOS control gate structure proposed by the present invention is compatible with the fabrication process of the gate electrode of the existing high voltage IGBTs.

Figure 1:
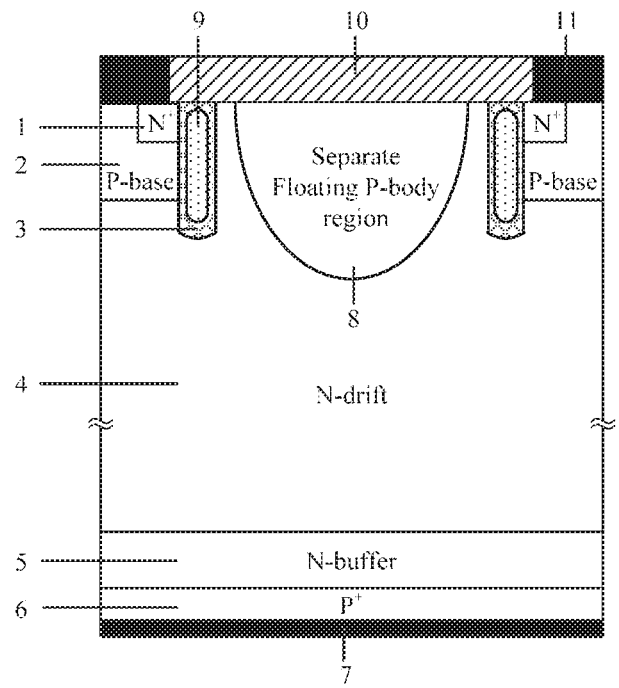
FIG. 1 shows a schematic diagram of a conventional separate floating p-body IGBT device.

The reference numerals in the drawings are as follows: 1. N+ emitter region; 2. P+ base region; 3. gate dielectric layer; 4. N-type drift region; 5. N-type buffer layer; 6. P+ collector region; 7. collector metal electrode; 8. P+ floating p-body region; 9. gate electrode; 10. dielectric layer; 11. emitter metal electrode; 12. connecting bridge; 13. P+ contact region; 14. MOS control gate electrode; 15. P-type MOS channel region.

DETAILED DESCRIPTION OF THE EMBODIMENTS

The following specific examples illustrate embodiments of the present invention, and a skilled person in the art can readily understand the other advantages and effects of the present invention by the disclosure of the specification. The present invention may also be implemented or applied by different concrete embodiments, and the details can be modified or changed based on different viewpoints and applications without departing from the spirit of the present invention.

Embodiment 1

Figure 2:
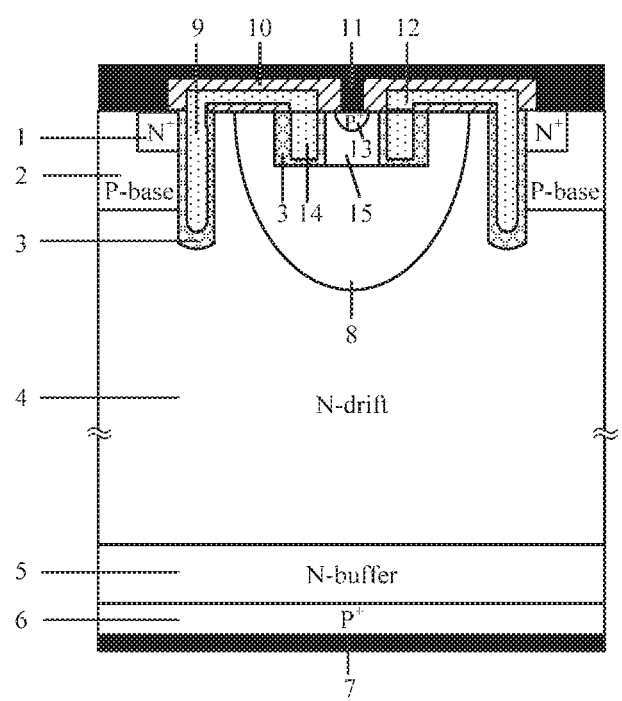
FIG. 2 shows a schematic diagram of an IGBT with a MOS controllable hole path according to Embodiment 1 of the present invention.

As shown in FIG. 2, an IGBT device with a MOS controllable hole path with its cell structure includes a collector metal electrode 7, a P+ collector region 6, a N-type buffer layer 5, a N-type drift region 4 and an emitter metal electrode 11. The collector metal electrode 7, the P+ collector region 6, the N-type buffer layer 5, the N-type drift region 4, and the emitter metal electrode 11 are stacked in order from bottom to top. The P+ floating p-body region 8 is disposed on the middle upper surface of the N-drift region 4. The P+ base region 2 is disposed on both sides of the P+ floating p-body region 8, respectively. The N+ emitter region 1 is disposed on the upper surface of the P+ base region 2. Upper surfaces of the N+ emitter region 1 and the P+ base region 2 are respectively connected to the emitter metal electrode 11. The IGBT gate structure is set between the N+ emitter region 1, the P+ base region 2 and the P+ floating p-body region 8. The IGBT gate structure is not in the P+ floating p-body region 8. The IGBT gate structure includes a gate electrode 9 and a gate dielectric layer 3. The gate dielectric layer 3 extends along a longitudinal direction of the device into the N-drift region 4 to form trench and the gate electrode 9 is embedded in the trench. One side of the gate dielectric layer 3 is in contact with the P+ base region 2, the N+ emitter region 1 and the N-drift region 4. The P+ floating p-body region 8 is not adjacent to the other side of the gate dielectric layer 3 and is separated with the other side of the gate dielectric layer 3 by the N-drift region 4.

The MOS control gate structure including a gate dielectric layer 3, a MOS control gate electrode 14 and a P-type MOS channel region 15 is embedded in the P+ floating p-body region 8. The P-type MOS channel region 15 is disposed on the middle upper surface of the P+ floating p-body region 8, which is connected to the P+ base region 2 and the N+ emitter region 1 by the P+ contact region 13 and emitter metal electrode 11. The MOS control gate electrode 14 is symmetrically disposed on both sides of the P-type MOS channel region 15 and is isolated from the P-type MOS channel region 15 by the gate dielectric layer 3. The MOS control gate electrode 14 is isolated from the P+ floating p-body region 8 by the gate dielectric layer 3. The MOS control gate electrode 14 is connected to the IGBT gate electrode 9 through the connecting bridge 12. The emitter metal electrode 11 and the connecting bridge 12, and the connecting bridge 12 and the N-drift region 4 are separated by a dielectric layer 10, respectively.

Preferably, the junction depth of the P+ floating p-body region 8 in this embodiment is greater than the depth of the IGBT trench gate. Thus, a depletion region between the P+ floating p-body region 8 and the N-drift region 4 is formed to weaken the electric field at the bottom of the trench gate during the forward blocking state, which thereby ensures the reliability of the forward voltage withstand capability of high voltage trench gate IGBT device.

Preferably, the MOS control gate structure is located in a neutral region of the P+ floating p-body region 8 during forward blocking state.

Preferably, a width of the P-type MOS channel region 15 is less than a width of the electron accumulation layer generated by the MOS control gate electrode 14 during on-state.

Preferably, the material of the semiconductor used in the device can be single crystal silicon, silicon carbide or gallium nitride.

The principle of the present invention will be described in detail below with reference to the embodiments.

When the proposed structure is forward blocked, the IGBT gate electrode 9 is at zero potential. The MOS control gate electrode 14 does not generate an implantation enhanced effect and the P+ floating p-body region 8 is directly connected to the zero potential through the MOS channel region 15, thereby providing an extra voltage withstanding PN junction between the P+ floating p-body region 8 and N-drift region 4. The junction depth of the P+ floating p-body region 8 is greater than the depth of the gate structure, which can reduce high electric fields at the bottom of the trench gate during forward blocking state, thereby achieving the same effects of the floating field limiting ring and contributing to the higher breakdown voltage. In contrast, the separate floating p-body region of the conventional separate floating p-body IGBT shown in FIG. 1 is in the floating potential during forward blocking, which can lower the electric fields at the bottom of the trench gate, while causes lower forward blocking voltage than the proposed structure and worse voltage dividing effect than connecting the p-body region to the zero potential.

When the device is in conduction under the forward voltage, the gate of the IGBT is at positive potential, the MOS control gate electrode 14 generates electron accumulation on the surface of the P-type MOS channel region 15 since the P-type MOS channel region 15 is lightly doped and a width of the electron accumulation layer is large enough to pinch off the hole path. Therefore, the P+ floating p-body region 8 can not be connected to ground potential. Electrons are injected from the conduction channel of the IGBT into the drift region 4, and holes are injected from the P+ collector region 6 on the back into the N-drift region 4, and the N-drift region 4 undergoes conductance modulation. Holes are stored in the P+ floating p-body region 8, thereby enhancing the carrier concentration in the N-drift region 4 according to the principle of electrical neutrality. Hence, the saturation conduction voltage drop of the proposed structure is approximately equivalent to that in the conventional IGBT.

During the turn-off transition, the potential of the MOS control gate electrode 14 decreases as the voltage of the IGBT gate electrode 9 decreases. At this time the number of electrons in accumulated layer will gradually decrease in the P type MOS channel region 15. Meanwhile, the P+ floating p-body region 8 is in ground potential during the switching transient and effectively shields IGBT gate electrode 9, resulting in the lower Miller capacitance. Hence, the switching time and switching loss are reduced.

Similarly, when the device is turned on during short-circuit, the potential of P-type MOS channel 15 is increased because of the higher voltage drop of the P+ floating p-body region 8 following the large withstanding voltage. In the meanwhile, however, the MOS control gate 14 provides positive gate voltage, the voltage drop of MOS channel region 15 is not large enough to generate accumulate electron layers, then the P+ floating p-body region 8 will be in ground potential through the P type MOS channel region 15, which can suppress the rising of short-circuit current by rapid discharging path for extra holes in N-drift region 4. It contributes to reduce the thermal runaway phenomena during the short-circuit. The extra holes of traditional structure could only be discharged by P+ base region 2 other than P+ floating p-body region 8 when it is turned off and turned on during short-circuit, which increases the turn-off loss. The traditional structure makes the short-circuit current larger induced by the positive feedback between the temperatures and leakage currents, which contributes to weaken the short-circuit withstand capability.

To verify the advantages of the present invention, a 3300V N-channel trench gate IGBT structure is illustrated as an example. Characteristics between the conventional IGBT device structure shown in FIG. 1 and the proposed IGBT structure of the present invention shown in FIG. 2 are simulated and compared by MEDICI software. The static parameters including forward blocking voltage, saturation conduction voltage drop, and threshold voltage, the dynamic parameters including Miller capacitance $C_{gc}$, turn-on loss and turn-off loss are shown in Table 1.

TABLE 1

Comparison of static and dynamic characteristics

| Parameters | Proposed IGBT | Conventional IGBT |
|---|---|---|
| Forward blocking Voltage (V) | 4279 | 3863 |
| Threshold Voltage (V) | 5.75 | 5.7 |
| Conduction voltage drop (V) | 2.44 | 2.38 |
| Miller Capacitance $C_{gc}$ ($10^{-19}$ F/μm²) | 8 | 22 |
| Turn-on energy Eon (mJ) | 30.75 | 32.73 |
| Turn-off energy Eoff (mJ) | 66.34 | 85.39 |

As shown in Table 1, the forward blocking voltage of the proposed structure is 4279V, which is 10.7% higher than that of the conventional structure. The conduction voltage drops are equivalent between two structures but the turn-on loss and turn-off loss of proposed structure are significantly reduced compared with the conventional structure. The Miller capacitance $C_{gc}$ is reduced by 63% and the turn-off loss is reduced by 22%, respectively, compared with the conventional structure.

Figure 4:
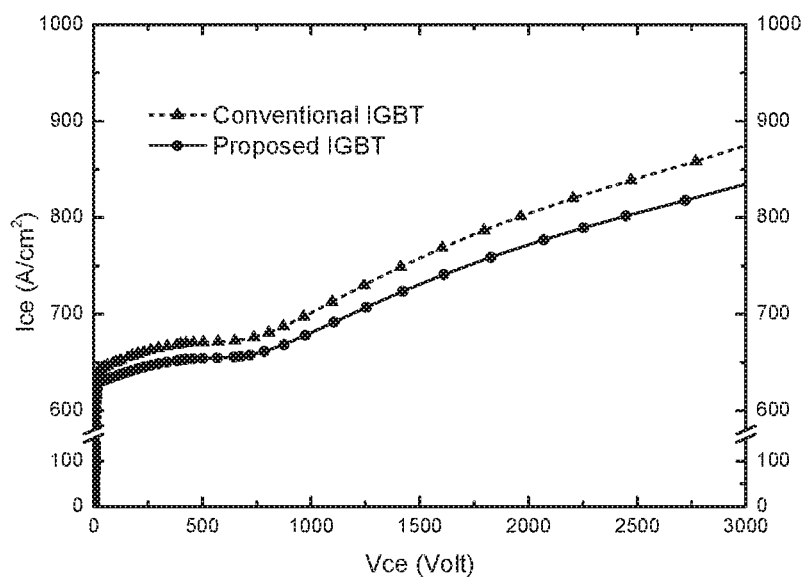
FIG. 4 shows a diagram of output characteristics of IGBTs between conventional structure and the proposed structure of present invention.
Figure 5:
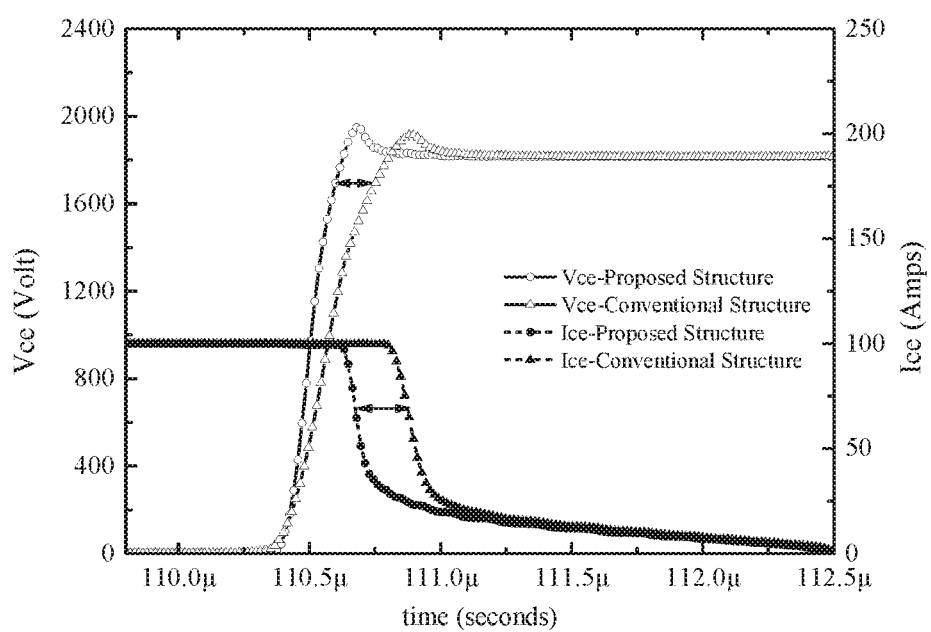
FIG. 5 shows a diagram of turn-off waveforms of IGBTs between conventional structure and the proposed structure of present invention.

The output characteristics shown in FIG. 4 suggests that the current density of the proposed structure is significantly lower than that of the conventional structure in the voltage range from 200V to 3000V. When device voltage Vce is 2500V, the short-circuit current of the proposed structure is reduced by 5%, which significantly enhances the short-circuit withstand capability of IGBTs. The simulation waveforms of switching process in FIG. 5 shows that the Vce and Ice changes of the proposed structure are significantly accelerated due to the reduction of the Miller capacitance $C_{gc}$ and the formation of the hole extracting path controlled by the MOS control gate structure, compared with the conventional structure.

In summary, the present invention provides an IGBT device with a MOS controllable hole path. Compared with the conventional structure, the present invention introduces a MOS control gate structure in the P+ floating p-body region which is compatible with the fabrication process of the existing high voltage IGBTs. The P+ floating p-body region 8 of proposed structure is in the floating potential during on-state to store holes and strengthen the conductivity modulation in the N-drift region, which can achieve a lower on-state voltage drop. During off-state and short-circuit on-state, the P+ floating p-body region 8 provides holes discharging path, which can reduce Miller capacitance, shorten turn-off time, achieve lower turn-off loss and strengthen the short-circuit withstand capability.

It should be particularly noted that an IGBT device with MOS controllable hole path in the present invention is not only applicable to the IGBT device of the high voltage ranging from 3300V to 6500V, but also suitable for the medium voltage IGBT devices based on the planar gate and the trench gate.

Embodiment 2

Figure 3:
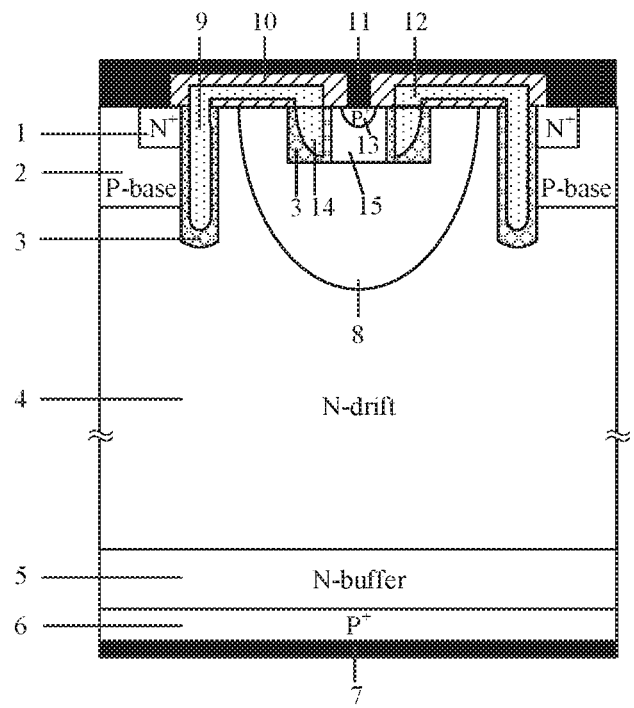
FIG. 3 shows a schematic diagram of an IGBT device with a MOS controllable hole path having a sharp-angle MOS control gate electrode according to Embodiment 2 of the present invention.

As shown in FIG. 3, the main difference between this embodiment and embodiment 1 is that: the MOS control gate electrode 14 is a sharp-angle MOS control gate structure, so as to further reduce the Miller capacitance.

The above-mentioned embodiments are merely some examples intended to illustrate the principle and effects of the present invention, rather than limit the present invention. Those skilled in the art will recognize improvements and modifications to the preferred embodiments of the present disclosure with no violation to the spirit and scope of the present invention. All such improvements and modifications derived by those of ordinary skill in the art without departing from the spirit and technical idea of the present invention shall be considered as falling within the scope defined by the appended claims

What is claimed is:

1. An IGBT device with a MOS controllable hole path, wherein:
   a cell structure of the IGBT device comprises a collector metal electrode, a P+ collector region, an N-type buffer layer, an N-type drift region, and an emitter metal electrode; the collector metal electrode, the P+ collector region, the N-type buffer layer, the N-type drift region, and the emitter metal electrode are stacked in order from bottom to top;
   a P+ floating p-body region is disposed on a middle upper surface of the N-drift region; P+ base regions are disposed on both sides of the P+ floating p-body region, respectively; the N+ emitter region is disposed on an upper surface of the P+ base region; the N+ emitter region and the P+ base region are respectively connected to the emitter metal electrode;
   an IGBT gate structure is set between the N+ emitter region, the P+ base regions and the P+ floating p-body region; the IGBT gate structure is not in the P+ floating p-body region; the IGBT gate structure comprises a gate electrode and a gate dielectric layer; the gate dielectric layer extends along a longitudinal direction of the IGBT device into the N-drift region to form a trench, and the gate electrode is embedded in the trench; a first side of the gate dielectric layer is in contact with the P+ base region, the N+ emitter region, and the N-drift region; the P+ floating p-body region is not adjacent to a second side of the gate dielectric layer and is separated with the second side of the gate dielectric layer by the N-drift region; and
   a MOS control gate structure comprising the gate dielectric layer, a MOS control gate electrode and a P-type MOS channel region is embedded in the P+ floating p-body region; the P-type MOS channel region is disposed on a middle upper surface of the P+ floating p-body region; a P+ contact region is disposed on an upper surface of the P-type MOS channel region and a surface of the P+ contact region is connected to the P+ base region and the N+ emitter region by the emitter metal electrode; the MOS control gate electrode is symmetrically disposed on both sides of the P-type MOS channel region and is isolated from the P-type MOS channel region by the gate dielectric layer; the MOS control gate electrode is isolated from the P+ floating p-body region by the gate dielectric layer; the MOS control gate electrode is connected to the IGBT gate electrode through a connecting bridge; and the connecting bridge and the N-drift region are respectively separated from the emitter metal electrode by a dielectric layer.

2. The IGBT device of claim 1, wherein the MOS control gate structure is located in a neutral region of the floating p-body region in a forward blocking state.

3. The IGBT device of claim 1, wherein a width of the P-type MOS channel region is less than a width of an electron accumulation layer generated by the MOS control gate electrode during an on-state.

4. The IGBT device of claim 1, wherein the MOS control gate electrode has a controllable hole path having the same structure as the IGBT gate electrode or a sharp-angle MOS control gate structure.

5. The IGBT device of claim 1, wherein a junction depth of the P+ floating p-body region is greater than a depth of the IGBT gate structure.

6. The IGBT device of claim 1, wherein a doping profile of the P+ floating p-body region is non-uniform doping.

7. The IGBT device of claim 1, wherein a material of a semiconductor used in the IGBT device is any one selected from the group consisting of single crystal silicon, silicon carbide, and gallium nitride.

* * * * *